United States Patent
Cheng et al.

(10) Patent No.: US 6,191,035 B1
(45) Date of Patent: Feb. 20, 2001

(54) RECIPE DESIGN TO PREVENT TUNGSTEN (W) COATING ON WAFER BACKSIDE FOR THOSE WAFERS WITH POLY SI ON WAFER BACKSIDE

(75) Inventors: Kuo-Hsien Cheng, Hsin-Chu; Chen-Mei Fan, Hsin-Chu, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/313,303

(22) Filed: May 17, 1999

(51) Int. Cl.$^7$ .................................................. H01L 21/44
(52) U.S. Cl. .................. 438/680; 438/694; 118/715; 118/725; 118/738; 427/248.1
(58) Field of Search .................. 438/694, 758, 438/716, 928, 680, 935; 118/728, 715, 724, 732, 725; 427/248.1, 255.1, 255, 392

(56) References Cited

U.S. PATENT DOCUMENTS

| | | | |
|---|---|---|---|
| 5,230,741 | * 7/1993 | Ven et al. | 118/728 |
| 5,374,594 | * 12/1994 | Ven et al. | 438/758 |
| 5,384,008 | 1/1995 | Sinha et al. | 156/643 |
| 5,505,779 | 4/1996 | Mizuno et al. | 118/719 |
| 5,620,525 | 4/1997 | van de Ven et al. | 118/728 |
| 5,679,405 | * 10/1997 | Thomas et al. | 427/248.1 |
| 5,769,951 | 6/1998 | van de Ven et al. | 118/725 |
| 5,882,417 | * 3/1999 | Ven et al. | 118/728 |
| 6,113,698 | * 9/2000 | Raaijmakers | 118/715 |

* cited by examiner

Primary Examiner—Charles Bowers
Assistant Examiner—Hsien-Ming Lee
(74) Attorney, Agent, or Firm—George O. Saile; Stephen B. Ackerman

(57) ABSTRACT

In a CVD vacuum chamber processing system for depositing a blanket of refractory material, such as tungsten, upon a frontside of a semiconductor wafer, an inert gas, such as argon is directed to the backside of the wafer in a manner so as to prevent the chamber reaction gases from reacting with polysilicon or other materials on the backside of the wafer as well as to prevent the deposition of the blanket material on the backside of the wafer. This method alleviates the problems of particulate generation and loss of wafer backside datum surface due to the inadvertent buildup of unwanted materials. The wafer is placed on a heater platen and is secured by a specified range of vacuum pressures. The wafer is exposed to specified ranges of chamber pressure during the deposition phase. During the purge phase, the chamber pressure is reduced and the wafer chucking pressure is increased to a specified range. The method is terminated with the equalization of pressure between the front and backside of the wafer.

18 Claims, 2 Drawing Sheets

RECIPE DESIGN TO PREVENT TUNGSTEN (W) COATING ON WAFER BACKSIDE FOR THOSE WAFERS WITH POLY SI ON WAFER BACKSIDE

BACKGROUND OF THE INVENTION (1) Field of the Invention

The invention relates to the fabrication of integrated circuit devices, and more particularly to a method and apparatus for preventing undesirable deposits of tungsten (W) on the backside of semiconductor wafers.

(2) Description of the Prior Art

During the multitude of processes in building a semiconductor device on the polished frontside of a wafer, the backside (unpolished side) of the wafer can be inadvertently exposed to the same processes as directed upon the frontside. In many instances, such exposure is inconsequential since the following process operations are tolerant or remedial of such exposure. However, in other process steps, the result of such exposure is detrimental and can prove troublesome in those subsequent processes and can ultimately limit the yield of good semiconductor devices from the wafer.

Well known in the semiconductor industry, is the problem of chemical vapor deposition (CVD) materials loosely adhering to the unprotected backside of a wafer. Such is the case when depositing tungsten (W). The mechanism for the problem is where tungsten flouride ($WF_6$) reacts with hydrogen ($H_2$) forming tungsten (W) on the frontside of the wafer and (HF) which inadvertently flows to regions at the backside of a wafer. There, additional $WF_6$ reacts with Silicon (Si) to form a nucleation layer of tungsten (W) as well as silicon flouride ($SiF_4$). Continued backside reaction of tungsten flouride ($WF_6$) with hydrogen ($H_2$) deposits tungsten (W) and produces additional HF. The HF then reacts with the native oxide which causes additional polysilicon to be exposed to tungsten flouride ($WF_6$).

Some of these partially coated backside materials become detached in subsequent processes and form particulates which can cause fatal defects in the evolving semiconductor devices. Also excessive uneven buildup of adhering deposited material on the backside of the wafer can deplanarize the backside, rendering the backside ineffective as a planar datum to assure accurate processing of the frontside, such as maintaining a consistent depth of focus during a photolithographic exposure operation. With respect to the current invention the problem is that a thin film of tungsten is deposited regionally on a backside layer of polysilicon which prevents subsequent stripping of the polysilicon results in a nonplanar wafer backside.

To avoid these kinds of problems, firstly, the unprotected backside of the wafer could be subsequently stripped of its undesirable deposited materials, resulting in an additional manufacturing step which adds to the cost and exposes the wafer to additional yield detracting handling. Or, secondly, the wafer backside could be protected from the deposition processes.

In one solution of the first kind, U.S. Pat. No. 5,384,008 (Ashok Sinha et al.) discloses a process and apparatus which utilizes a necessary subsequent etching process step to remedy a backside deposition problem by use of a reduced size wafer pedestal. However, the deposited material removal is limited to a generally annular area at the periphery of the backside of the wafer. It does not address the problem of deposits near the center of the backside of the wafer which is the problem necessitating the present invention, Furthermore, it does not address the general problem of being an added costly manufacturing step for depositions not requiring an immediate subsequent etching step. Yet, this procedure does make maximum use of semiconductor "real-estate" at the periphery of the frontside of the wafer in that no protective device shields any part of the frontside of the wafer.

Solutions of the second kind are varied to include shadow rings which interfere with making maximum use of wafer frontside "real estate"; wafer periphery seal clamps which in themselves can be a source of particulate generation; and control of chamber gas flow in a relatively non contacting gap near the periphery of the wafer; all of which require additional equipment hardware associated with the wafer chucking heater platen.

U.S. Pat. No. 5,679,405 (Thomas et al) discloses a method whereby a heated inert gas is introduced beneath the wafer and vents at the periphery preventing process gases from contacting the backside of the wafer. The backside pressure is adjusted to compensate for the process pressure which is typically about 10 torr, the difference in pressure being between 1–5 torr, thus maintaining the chucking action.

U.S. Pat. No. 5,620,525 (van de Ven et al.) discloses an apparatus which supplies an inert gas at a greater pressure than the process chamber pressure to an annulus formed by a guard ring and the platen at the periphery of the wafer, thus not interfering with the chucking action, but requiring a guard ring design that will not interfere with the deposition process on the wafer frontside.

U.S. Pat. No. 5,769,951 (van de Ven et al.) further discloses similar apparatus but with shadowing device features.

U.S. Pat. No. 5,505,779 (Mizuno et al.) uses a similar method but establishes an optimum ratio of gap size to inert gas flow rate to control the location of the peripheral portion of the deposited thin film.

The mechanisms producing the undesirable deposits of contamination material are varied and can be due to some ancillary portion of the overall deposition process. All of the above prior art deal with either the remedy for or the prevention of deposition on the wafer backside occasioned during the main phase of the deposition process, but do not address the problem of inadvertent backside deposition during the CVD chamber purge phase in which the residual deposition gases are removed from the chamber after deposition and during the equalization phase in which the pressure across the front and back sides of the wafer is equalized.

SUMMARY OF THE INVENTION

A principal object of the present invention is to prevent the deposition of tungsten (W) or other refractory materials on the backside of a wafer during the purge and equalization phases following the chemical vapor deposition of tungsten (W) or other refractory materials upon the frontside of the wafer.

Another object of the present invention is to provide a new recipe for operation and control of the gases and the pressures in a CVD apparatus to preclude the undesirable deposition of refractory materials on the backside to the wafer.

An additional object of the present invention is to avoid making modifications to the existing equipment either within the chamber, primarily to the heater platen and wafer chucking means or to the piping by utilizing the new recipe for operation and control of the gases and the pressures therein.

Yet another object of the present invention is to improve purge efficiency after the deposition phase by decreasing chamber pressure to reduce the residual gas concentration.

In accordance with the objects of this invention a new method (recipe) for the application of chamber and wafer backside gases at optimum pressures is employed.

A wafer is vacuum chucked on a planar heater platen in a chemical vapor deposition chamber exposing the wafer frontside to a shower of chemical vapors for the purpose of depositing tungsten on the entire frontside of the wafer. The vacuum chucking device operates to generally provide a seal between the chamber deposition gases and the wafer backside vacuum as well as providing stability to meet wafer orientation requirements. Additionally, a specified flow of argon gas is directed to the backside of the wafer during the deposition and purge phases. A specified sequence and range of gas pressures is applied to the front and back sides of the wafer. The inventive step in this approach is found in the modification of the pressures and flow of the inert gas during the purge and equalization phases.

DESCRIPTION OF THE DRAWINGS

In the accompanying drawings forming a material part of this description, there is shown.

DESCRIPTION OF THE PREFERRED EMBODIMENT

The CVD Chamber

Figure 1:
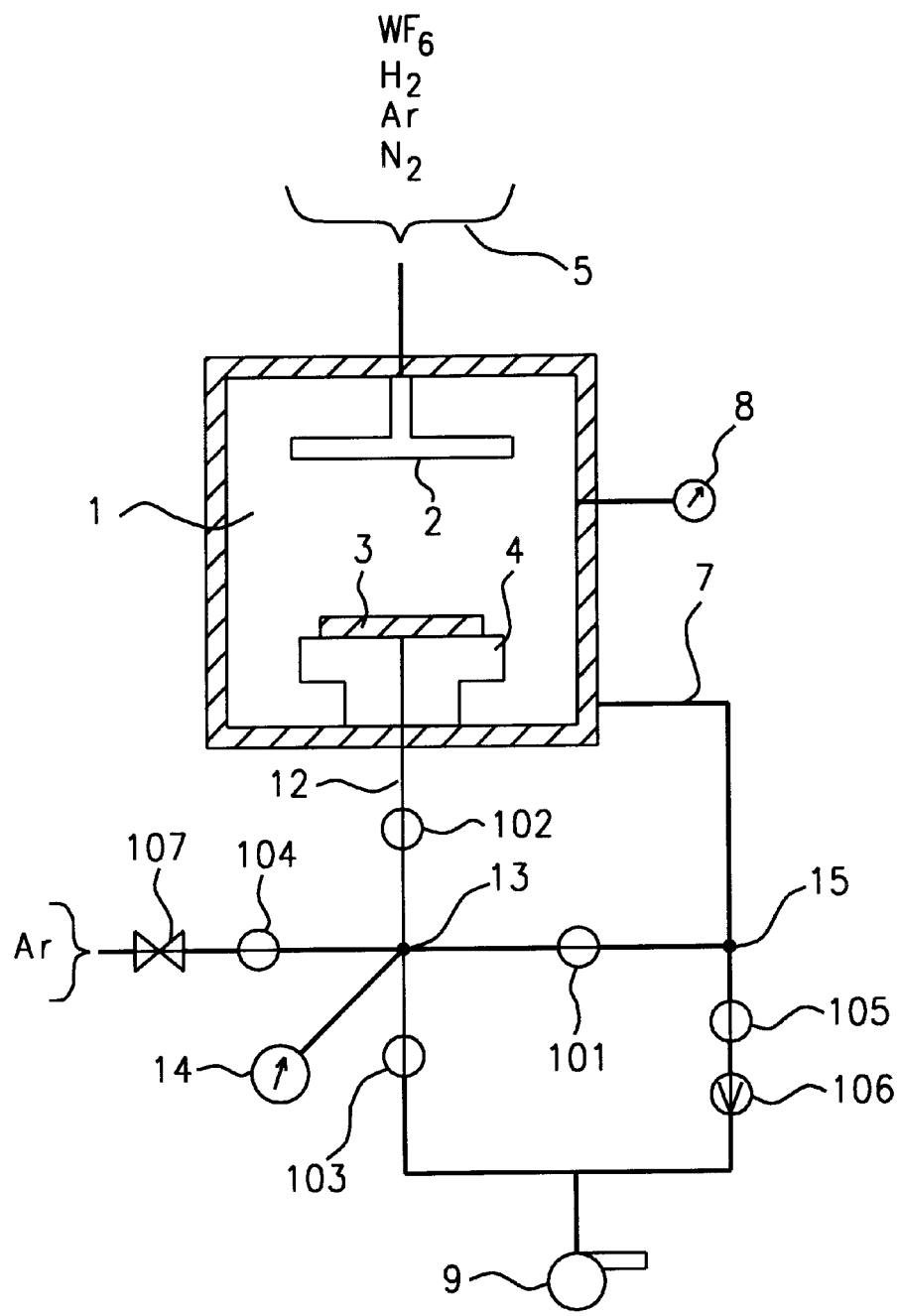
FIG. 1 is a vertical cross-sectional schematic of a CVD chamber with its associated internal components and its external gas piping.

Illustrated in FIG. 1 is a schematic depicting the significant portions of one of a plurality of chemical vapor deposition apparatus. Contained in a CVD process chamber 1 is a heater platen 4 and a deposition gas shower head 2. A wafer 3 is retained on the heater platen 4, with its entire frontside exposed to the deposition vapors entering the chamber 1 from the shower head 2. Deposition and reactive gases $WF_6$, $H_2$, Ar and $N_2$ are supplied to the shower head 2 via deposition gas supplies 5. Details of the control and the valves of these gas supplies 5 are not shown. A chamber exhaust line 7 is opened to a source of vacuum provided by vacuum pump 9 by exhaust valve 105 at junction 15 and the residual chamber gases flow through chamber exhaust line 7, limited by throttle valve 106. In this manner a normal flow of deposition or purge gases flow through chamber 1 while maintaining the pressures listed in chart 1. The chamber pressure value is monitored by a vacuum gauge device 8 for the purpose of maintaining the listed pressures. The chamber 1 is evacuated to pressures ranging between 60 and 120 torr according to the process phases of deposition, purge and equalization as listed in chart 1, below.

The Heater Platen

Figure 2:
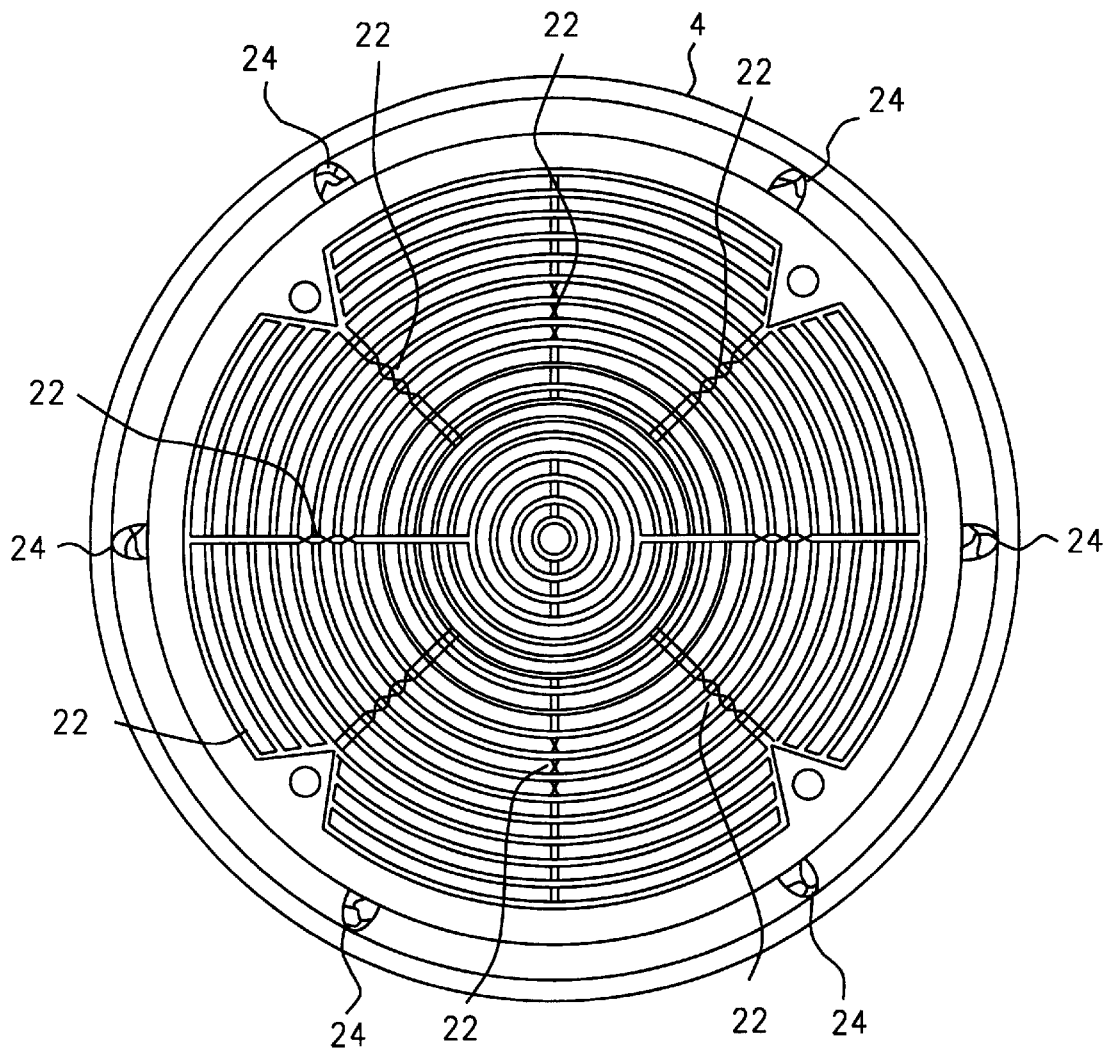
FIG. 2 is a top plan view of the heater platen.
Figure 3:
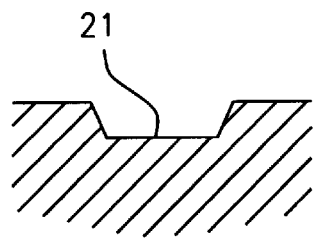
FIG. 3. is a cross section view of the grooves in the heater platen.

Refer to FIG. 2. A top plan view of the heater platen 4 is shown essentially comprising a flat surface with a plurality of interconnected concentric grooves 21 therein to provide chucking vacuum to the backside of the wafer 3. The wafer 3 is chucked concentrically on the heater platen 4 by the sequential effect of the centering pins 24 and the application of vacuum. A plurality of openings 22 in the bottom of the grooves assisting in the even distribution of vacuum over the heater platen 4 are connected via piping 12 (FIG. 1) to communicate with the vacuum pump 9.

Refer again to FIG. 1. Piping 12 is connected serially through the heater platen valve 102, a piping junction 13 and a vacuum valve 103 to the source of vacuum 9. A pressure equalization bypass valve 101 is interposed between junction 13 on pipe 12 and junction 15 on chamber exhaust line 7 and is operable to effect an equalization of pressure between the chamber 1 and the backside of the wafer 3 during the equalization operation. Pressure gauge 14, connected at junction 13, effectively monitors the pressure at the backside of the wafer 3 which can range between 0–120 torr; and together with pressure gauge 8, the pressure settings found in chart 1 can be attained and maintained between the front and back sides of wafer 3.

Additionally connected at junction 13 is a source of Argon (Ar) via a mass flow controller (MFC) 107 and Ar flow valve 104. The MFC controls Ar gas flow to compensate for the gas pumping.

Although the apparatus of FIG. 1 is illustrative of the preferred embodiment, other piping and platen arrangements may employ or be adapted to employ the new (recipe) method of the present invention as described below.

The Recipe (Chart 1)

The original and the modified (new recipe) valve and pressures settings for the deposition, purge and equalization phases are listed in chart 1. It should be noted that during all of the phases, the heater platen valve 102 and exhaust valve 105 always remain open and are listed for sake of completeness. During both the deposition and purge phases, the pressure equalization valve 101 remains closed, and the vacuum valve 103 remain open thereby causing two separate flows of gases to the vacuum source 9 resulting in a pressure differential between the chamber 1 and at the wafer backside.

CHART 1

|  | Original | Modified |
|---|---|---|
| Deposition Phase $WF_6,H_2,Ar,N_2$ | | |
| Chamber Pressure | 70–120 torr | same |
| Wafer Backside Pressure | 20–45 torr | same |
| Valve #1 (by-pass) | closed | same |
| Valve #2 (heater platen) | open | same |
| Valve #3 (vacuum) | open | same |
| Valve #4 (Argon) | open | same |
| Valve #5 (chamber exhaust) | open | same |
| Purge Phase $H_2,Ar,N_2$ | | |
| Chamber Pressure | 70–120 torr | 60–100 torr |
| Wafer Backside Pressure | 0 torr | 20–60 torr |
| Valve #1 (by-pass) | closed | same |
| Valve #2 (heater platen) | open | same |
| Valve #3 (vacuum) | open | same |
| Valve #4 (Argon) | closed | open |
| Valve #5 (chamber exhaust) | open | same |
| Equalization Phase Ar, $N_2$ | | |
| Chamber Pressure | 70–120 torr | 60–120 torr |
| Wafer Backside Pressure | 70–120 torr | 60–120 torr |
| Valve #1 (by-pass) | open | same |
| Valve #2 (heater platen) | open | same |
| Valve #3 (vacuum) | closed | same |
| Valve #4 (Argon) | closed | same |
| Valve #5 (chamber exhaust) | open | same |

To better understand the inventive step, the following is a discussion of the operations employing the original settings for the deposition, purge and equalization phases.

During the deposition phase, deposition and reactive gases $WF_6$, $H_2$, Ar and $N_2$ enter the chamber through the gas shower head 2 under control of the deposition gas supplies 5 and are exhausted serially through chamber exhaust line 7, open exhaust valve 105, and pressure controlling throttle valve 106 by vacuum pump 9. The throttle valve 106 controls the chamber pressure which is set to produce between 70–120 torr during the deposition phase. At the same time the wafer 3 is chucked to the heater platen 4 at a lower pressure between 20–45 torr, created by the vacuum pump 9 communicating with the heater platen 4 via opened heater platen valve 102 and opened vacuum valve 103, and is attained by closure of the bypass valve 101 and maintained by a fixed flow rate of argon gas through the mass flow controller (MFC) 107 and argon valve 104. Argon gas permeates the piping 12 and is present at the wafer backside. Deposition times is in the range of 40–90 seconds and is typically 55 seconds.

During the purge phase, the flow of deposition gas $WF_6$ is terminated under the control of deposition gas supplies 5 while continually maintaining a flow of purge gases $H_2$, Ar and $N_2$ into the chamber. The purge gases exiting the chamber together with the residual gases formed in the deposition phase are exhausted via chamber exhaust line 7, opened chamber exhaust valve 105 and throttle valve 106 to the vacuum pump 9 in the same manner as during the deposition phase. The chamber is maintained at a pressure between 70–120 torr. At the same time the wafer 3 remains chucked to the heater platen 4 in communication with the vacuum pump 9 via opened heater platen valve 102 and opened vacuum valve 103. However the pressure at the wafer backside has been further reduced to approximately 0 torr by action the vacuum pump 9 and closure of the argon valve 104. The purge time is in the range of 3–10 seconds and is typically 5 seconds.

During the equalization phase, with the argon valve 104 remaining closed, simultaneously the vacuum valve 103 is closed to terminate the vacuum to the heater platen 4 and the bypass valve 101 is opened to relieve the pressure difference between the front and back sides of wafer 3. The equalization time is approximately 5 seconds.

Alternatively, the argon valve 104 may be opened during the equalization phase and may continue to remain open in the time period between the processing of a first and subsequent second wafer.

In the above original sequence of pressure setting and valve operations it is theorized that the large pressure differential between the chamber and the wafer backside is conducive to causing a sufficiently large enough flow of residual gases remaining in the chamber and chamber exhaust line 7 to enter the heater platen piping 12 when the bypass valve 101 is opened resulting in the undesirable film of tungsten (W) being deposited on the wafer backside polysilicon surface. This phenomenon has been observed across the plurality of chambers.

While it may be intuitive to suggest a longer purge time to assure a smaller remainder of residual gas in the chamber and in chamber exhaust line 7, it is not possible to remove all remaining residual gas especially that residing in the proximity to the bypass valve 101. And while it may seem intuitive to suggest relieving the chucking vacuum by closing the vacuum valve 103 first and allowing a continual flow of argon gas through the argon valve 104 to the wafer backside until equalization is attained before opening the bypass valve 101, such operation can cause detrimental movement of the wafer.

However, the approach taken in response to the theory and wafer in situ requirement, during the purge phase, is to continue the flow of argon to the wafer backside by having the argon valve remain open and to continue a moderate chucking vacuum set at between 20–60 torr, and at the same time to reduce the chamber pressure to between 60–100 torr as illustrated under the modified settings found in chart 1.

It was found that a lower chamber pressure during the purge phase improves the purge efficiency (change in the amount of residual gas per unit of time) which lowers the concentration of the remaining residual gas in the chamber 1 and chamber exhaust line 7 at the end of the purge phase. Moreover, a continuous flow of argon gas to the wafer backside at the moderate chucking pressure of between 20–60 torr increases the concentration of argon at the wafer backside. Furthermore the lower pressure differential between the chamber and the wafer backside further limits the propensity for a significant volume of the remaining residual gases in the chamber 1 and in the chamber exhaust line 7 to pass through the bypass valve 101 during the equalization phase. At the time when pressure equalization is achieved the argon valve 104 is then closed.

While the preferred embodiment employs the specified ranges of pressures and time periods as well as valve sequences with regard to the deposition of Tungsten (W), it is within the scope of the present invention that other pressure and time ranges may be employed with respect to the deposition of other refractory materials in accordance with the above-mentioned theory.

While the invention has been particularly shown and described with reference to the preferred embodiments thereof, it will be understood by those skilled in the art that various changes in form and details may be made without departing from the spirit and scope of the invention.

What is claimed is:

1. A method of chemical vapor deposition, vapor purging and pressure equalization in a vacuum chamber for depositing a layer of a refractory material on the frontside of a wafer made of semiconductor material without depositing residual refractory materials onto the wafer backside which comprises:

providing a flow of an inert gas to the backside of the wafer while maintaining a first wafer backside pressure;

depositing the refractory material on the frontside of the wafer while maintaining a first chamber pressure, the first chamber pressure being higher than the first wafer backside pressure;

purging the chamber while maintaining a second wafer backside pressure and a second chamber pressure, the second chamber pressure being lower than the first chamber pressure; and equalizing the pressure differential between the frontside and the backside of the wafer while maintaining a third chamber pressure.

2. A method according to claim 1 wherein the first chamber pressure is maintained between 70–120 torr.

3. A method according to claim 1 wherein the first wafer backside pressure is maintained between 20–45 torr.

4. A method according to claim 1 wherein the second chamber pressure is maintained between 60–100 torr.

5. A method according to claim 1 wherein the second wafer backside pressure is maintained between 20–60 torr.

6. A method according to claim 1 wherein the third chamber pressure is maintained between 60–120 torr.

7. A method according to claim 1 wherein the refractory material is tungsten.

8. A method according to claim 1 wherein the inert gas consists of argon.

9. A method according to claim 1 wherein the backside of the wafer is coated with a layer of polysilicon.

10. A method of chemical vapor deposition, vapor purging and pressure equalization in a vacuum chamber for depositing a layer of a refractory material on the frontside of a wafer made of semiconductor material without depositing residual refractory materials onto the wafer backside which comprises:

provided a wafer chucking means in the vacuum chamber, a wafer chucking pressure control means, a source of an inert gas, a source of deposition gases, a source of purge gases, a chamber pressure control means, a pressure equalization means;

placing the wafer backside on the wafer chucking means; maintaining a first chucking pressure by the wafer chucking pressure control means, flowing the inert gas to the backside of the wafer via the wafer chucking means;

maintaining a first chamber pressure by the chamber pressure control means, the first chamber pressure being higher than the first chucking pressure;

introducing a source of deposition gases into the chamber for the purpose of depositing a layer of refractory material on the frontside of the wafer;

after depositing the layer of refractory material, purging the chamber of residual deposition gases by introducing the purge gases into the chamber;

maintaining a second chamber pressure and a second chucking pressure respectively by the chamber pressure and the chucking pressure control means;

after purging the chamber of residual gases, equalizing the pressure between the chamber and the wafer backside by engaging the pressure equalization means; and maintaining a third chamber pressure by the chamber pressure control means.

11. A method according to claim 10 wherein the first chamber pressure is maintained between 70–120 torr.

12. A method according to claim 10 wherein the first chucking pressure is maintained between 20–45 torr.

13. A method according to claim 10 wherein the second chamber pressure is maintained at 60–100 torr.

14. A method according to claim 10 wherein the second wafer backside pressure is maintained at 20–60 torr.

15. A method according to claim 10 wherein the third chamber pressure is maintained between 60–120 torr.

16. A method according to claim 10 wherein the refractory material is tungsten.

17. A method according to claim 10 wherein the inert gas is argon.

18. A method according to claim 10 wherein the backside of the wafer is coated with a layer of polysilicon.

* * * * *